United States Patent
Cone et al.

(10) Patent No.: US 12,415,357 B2
(45) Date of Patent: Sep. 16, 2025

(54) METHOD OF CLEANING FLUID DISPENSER BY APPLYING SUCTION FORCE AND VIBRATING MENISCUS

(71) Applicant: CANON KABUSHIKI KAISHA, Tokyo (JP)

(72) Inventors: Craig William Cone, Austin, TX (US); Qi Ni, Pflugerville, TX (US); Hiroyuki Kondo, Utsunomiya (JP); Antoine Dellinger, Liberty Hill, TX (US); Steven C Shackleton, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 846 days.

(21) Appl. No.: 17/081,332

(22) Filed: Oct. 27, 2020

(65) Prior Publication Data

US 2022/0126332 A1    Apr. 28, 2022

(51) Int. Cl.
*B41J 2/165* (2006.01)
*B08B 5/04* (2006.01)
(Continued)

(52) U.S. Cl.
CPC ............ *B41J 2/16517* (2013.01); *B08B 5/04* (2013.01); *B08B 7/02* (2013.01); *B29C 64/35* (2017.08);
(Continued)

(58) Field of Classification Search
CPC ............ B41J 2/165–16588; B41J 2002/16567
See application file for complete search history.

(56) References Cited

U.S. PATENT DOCUMENTS 5,574,485 A * 11/1996 Anderson ............ B41J 2/16552
                                                            134/1
6,334,662 B2    1/2002 Hollands
(Continued)

FOREIGN PATENT DOCUMENTS

CN    1745903 A    3/2006
CN    1262417 C    7/2006
(Continued)

OTHER PUBLICATIONS

Osman A. Basaran, et al., Nonstandard Inkjets, Annual Review of Fluid Mechanics, vol. 45, pp. 85-113, Annual Reviews, Palo Alto, CA, 2013.

(Continued)

*Primary Examiner* — Eric W Golightly
*Assistant Examiner* — Richard Z. Zhang
(74) *Attorney, Agent, or Firm* — Canon U.S.A., Inc. IP Division (57) ABSTRACT

A method of cleaning a fluid dispenser for dispensing a material during non-contact maintenance of the fluid dispenser. The fluid dispenser including a plurality of nozzles disposed on a faceplate. The method including applying a suction force onto a surface of the faceplate using a suction apparatus, the suction apparatus being translated from one end of the faceplate to an opposite end of the faceplate such that a portion of nozzles from the plurality of nozzles are exposed to the suction force. The method continues by vibrating a menisci of the portion of nozzles that are exposed to the suction force to remove at least a portion of the material accumulated on the faceplate.

16 Claims, 8 Drawing Sheets

(51) Int. Cl.
*B08B 7/02* (2006.01)
*B29C 64/112* (2017.01)
*B29C 64/35* (2017.01)
*B41J 2/045* (2006.01)
*G03F 7/00* (2006.01)
*G03F 7/16* (2006.01)

(52) U.S. Cl.
CPC ......... *B41J 2/04596* (2013.01); *B41J 2/1652* (2013.01); *G03F 7/0002* (2013.01); *G03F 7/16* (2013.01); *B29C 64/112* (2017.08); *B41J 2002/16567* (2013.01)

(56) References Cited

U.S. PATENT DOCUMENTS

| | | |
|---|---|---|
| 6,561,621 B2 | 5/2003 | Webster et al. |
| 6,715,855 B2 | 4/2004 | Oda et al. |
| 6,936,194 B2 | 8/2005 | Watts |
| 7,157,036 B2 | 1/2007 | Choi et al. |
| 8,066,930 B2 | 11/2011 | Sreenivasan et al. |
| 8,076,386 B2 | 12/2011 | Xu et al. |
| 8,349,241 B2 | 1/2013 | Sreenivasan et al. |
| 8,506,041 B2 | 8/2013 | Osumi et al. |
| 9,452,607 B2 | 9/2016 | Kuypers et al. |
| 2003/0189614 A1* | 10/2003 | Steinfield ............. B41J 2/16517 347/22 |
| 2004/0046828 A1* | 3/2004 | Yamada ............... B41J 2/16532 347/30 |
| 2004/0075713 A1* | 4/2004 | Takano ................ B41J 25/3086 347/37 |
| 2008/0238974 A1 | 10/2008 | Takahashi |
| 2009/0303283 A1 | 12/2009 | Nakano et al. |
| 2010/0096764 A1 | 4/2010 | Lu |
| 2015/0009261 A1* | 1/2015 | Watanabe ............. B41J 2/1652 347/30 |
| 2016/0288374 A1* | 10/2016 | Thiruvengadachari ..................... G03F 7/0002 |
| 2019/0101823 A1 | 4/2019 | Patel et al. |
| 2019/0184699 A1* | 6/2019 | Yonehara ............. B41J 2/04543 |
| 2019/0291414 A1* | 9/2019 | Suzuki ................ B41J 2/04573 |
| 2021/0245510 A1* | 8/2021 | Rosenberg .............. B41J 2/175 |

FOREIGN PATENT DOCUMENTS

| | | | |
|---|---|---|---|
| CN | 110001208 A | | 7/2019 |
| JP | 2004337708 A | | 12/2004 |
| JP | 2006248189 A | | 9/2006 |
| JP | 2006297655 A | * | 11/2006 |
| JP | 2009247921 A | | 10/2009 |
| KR | 20170102805 A | * | 9/2017 |

OTHER PUBLICATIONS

U.S. Appl. No. 16/844,782, filed Apr. 8, 2020.

* cited by examiner

METHOD OF CLEANING FLUID DISPENSER BY APPLYING SUCTION FORCE AND VIBRATING MENISCUS

BACKGROUND

Field of Art

The present disclosure relates to a method of cleaning a dispenser during non-contact maintenance of the dispenser, in particular, the cleaning method may be applied to a dispenser associated with an ink jet head.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

The nano-fabrication technique involves dispensing the formable material from a dispenser onto the substrate. Over many dispensing cycles, the formable material may begin to accumulate on a faceplate of the dispenser. Eventually, the amount of accumulation can interfere with the production and requires maintenance. A cleaning method and cleaning system that does not physically contact the faceplate when cleaning the formable material accumulated on the faceplate of the dispenser is typically preferred. However, a cleaning method and cleaning system that does not physically contact the faceplate uses a suction apparatus. If the suction apparatus is too close to the faceplate or the suction force/power is too strong, it may cause a meniscus associated with a nozzle of the faceplate to break. The meniscus is a curved upper surface of the fluid in the nozzle. Thus, there is a need in the art for a cleaning method and system that does not physically contact the faceplate while preventing breakage of the meniscus associated with nozzles of the faceplate of the fluid dispenser.

SUMMARY

The present disclosure includes a method for cleaning a fluid dispenser during non-contact maintenance of the fluid dispenser without breaking the meniscus associated with each nozzle of the fluid dispenser.

A method of cleaning a fluid dispenser for dispensing a material during non-contact maintenance of the fluid dispenser. The fluid dispenser including a plurality of nozzles disposed on a faceplate. The method including applying a suction force onto a surface of the faceplate using a suction apparatus, the suction apparatus being translated from one end of the faceplate to an opposite end of the faceplate such that a portion of nozzles from the plurality of nozzles are exposed to the suction force. The method continues by vibrating a menisci of the portion of nozzles that are exposed to the suction force to remove at least a portion of the material accumulated on the faceplate.

A dispensing system including a fluid dispenser configured to dispense a material, with a faceplate, a plurality of nozzles and a suction apparatus for applying a suction force onto a faceplate. The dispensing system also including one or more processors and one or more memories storing instructions, when executed by the one or more processors, causes the dispensing system to apply the suction force onto a surface of the faceplate using the suction apparatus, the suction apparatus being translated from one end of the faceplate to an opposite end of the faceplate such that a portion of nozzles from the plurality of nozzles are exposed to the suction force and vibrating a menisci of the portion of nozzles that are exposed to the suction force to remove at least a portion of the material accumulated on the faceplate.

A method of making an article including cleaning a fluid dispenser with a faceplate having a plurality of nozzles, the cleaning including applying a suction force onto a surface of the faceplate using a suction apparatus, the suction apparatus being translated from one end of the faceplate to an opposite end of the faceplate such that a portion of nozzles from the plurality of nozzles are exposed to the suction force, and vibrating a menisci of the portion of nozzles that are exposed to the suction force to remove at least a portion of material accumulated on the faceplate. The method of making an article continues by dispensing a portion of the material onto a substrate using the fluid dispenser, forming a pattern or a layer of the dispensed material on the substrate and processing the formed pattern or layer to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure, and are therefore not to be considered limiting of its scope, for the disclosure may admit to other equally effective embodiments.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Throughout this disclosure, reference is made primarily to nanoimprint lithography, which uses the above-mentioned patterned template to impart a pattern onto formable liquid. However, as mentioned below, in an alternative embodiment, the template is featureless in which case a planar surface may be formed on the substrate. In such embodiments where a planar surface is formed, the formation process is referred to as planarization. Thus, throughout this disclosure, whenever nanoimprint lithography is mentioned, it should be understood that the same method is applicable to planarization. The term superstrate is used in place of the term template in instances where the template is featureless.

Advances in inkjet technology has facilitated fabrication processes across a wide range of technology. Nanoimprint lithography is one technology that uses inkjet heads for its process. Inkjet heads eject drops of fluid (for example photoresist) from microscopic nozzles and deposit them on substrates. The drops targeted to a surface to fabricate three-dimensional (3D) structures such as electronic components as well as materials for applications in life sciences. Inkjet technology is popular in the development of nanotechnology because it can precisely deposit picoliter volumes of solutions or suspensions in well-defined patterns. The fluid deposited is a functional material such as a photoresist. One method is a single drop on demand (DOD). An electric voltage signal is applied to a piezoelectric (PZT) transducer to cause mechanical deformations of a fluid chamber to squeeze the fluid out of the nozzle and form a drop, mimicking the manner in which gravity causes the liquid to drip from larger nozzles. Volume and velocity of individual drops and the time interval between two successive drops can be fully controlled by the appropriate adjustment of voltage signals, such as waveforms, voltage amplitudes and voltage durations.

A nano-fabrication technique using inkjet heads involves dispensing formable material from a dispenser onto a substrate. However, over many dispensing cycles, the formable material may accumulate on a faceplate of the dispenser. Eventually, the amount of accumulation can interfere with the production and needs cleaning. The present disclosure is concerned with a non-contact air cleaning method that avoids breaking the meniscus of nozzles located on the faceplate of the dispenser. The fluid or formable material dispenser exists within a nanoimprint lithography system discussed below with reference to FIG. 1.

Figure 1:
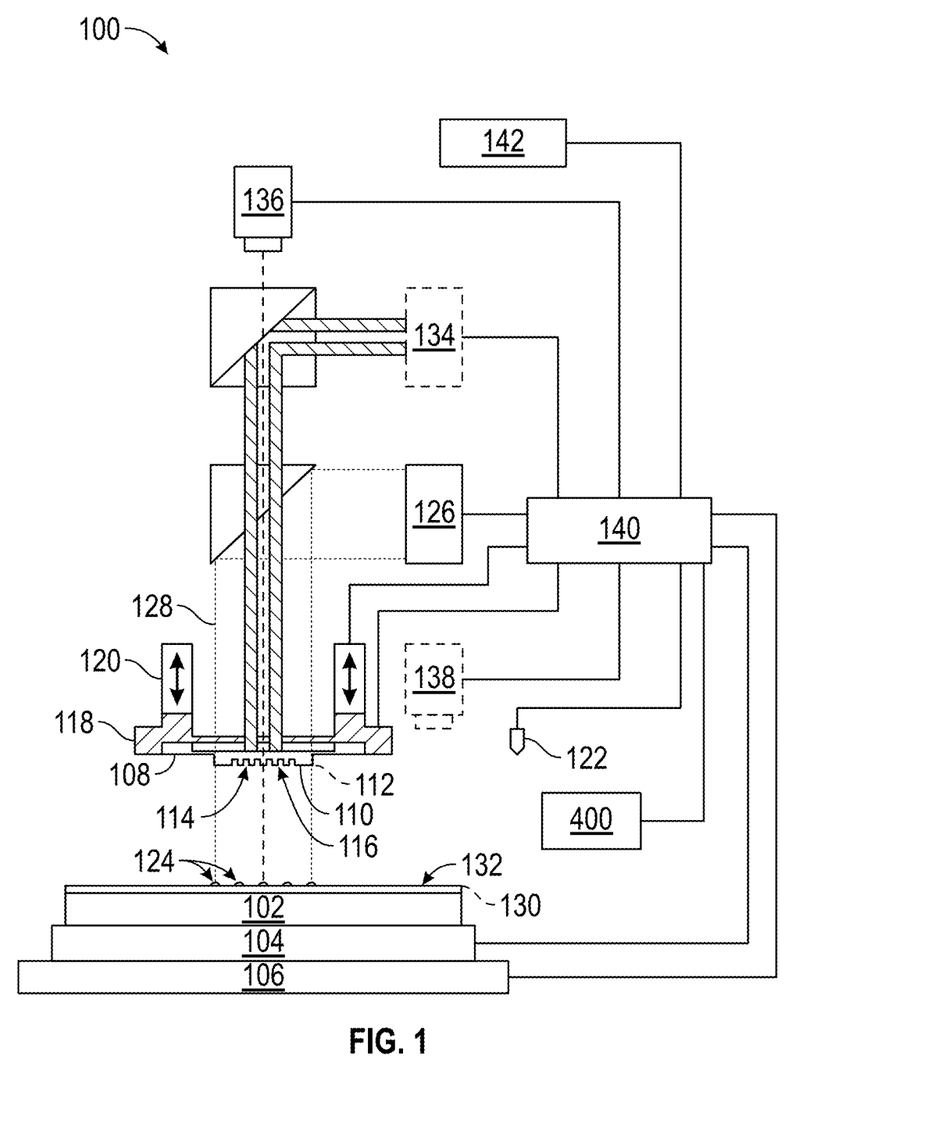
FIG. 1 is an illustration of an exemplary nanoimprint lithography system in accordance with an example embodiment.

FIG. 1 is an illustration of a nanoimprint lithography system 100. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mold 110 extending towards the substrate 102 on a front side of the template 108. The mold 110 may have a patterning surface 112 thereon also on the front side of the template 108. Alternatively, the template 108 may be formed without the mold 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to form on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate. In such embodiments where a planar surface is formed, the formation process may be alternatively referred to as planarization and the featureless template may be alternatively referred to as a superstrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head 120 may be moveably coupled to a bridge. The imprint head may include one or more actuators such as voice coil motors, piezoelectric motors, linear motor, nut and screw motor, etc, which are configured to move the template chuck 118 relative to the substrate in at least the z-axis direction, and potentially other directions (e.g. x, y, θ, ψ, and (φ-axes).

The nanoimprint lithography system 100 further comprises a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 110 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers dispense the formable material 124. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a radiation source 126 that directs actinic energy along an exposure path 128. The imprint head 120 and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track of the progress over the imprinting process.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system 100 may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 124. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate 102, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprint fields that are spread across the substrate surface 130. Each of the imprint fields may be the same size as the mold 110 or just the pattern area of the mold 110. The pattern area of the mold 110 is a region of the patterning surface 112 which is used to imprint patterns on a substrate 102 which are features of the device or are then used in subsequent processes to form features of the device. The pattern area of the mold 110 may or may not include mass velocity variation features which are used to prevent extrusions. In an alternative embodiment, the substrate 102 has only one imprint field which is the same size as the substrate 102 or the area of the substrate 102 which is to be patterned with the mold 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mold 110.

Figure 2:
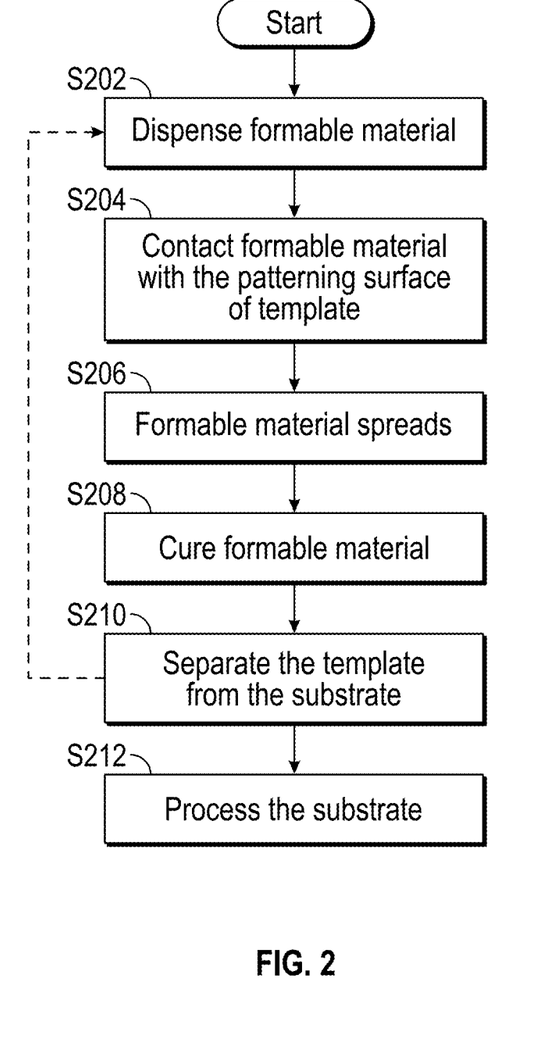
FIG. 2 is a flowchart illustrating an exemplary imprinting method in accordance with an example embodiment.

FIG. 2 is a flowchart of an imprinting process by the nanoimprint lithography system 100 that can be used to form patterns in formable material 124 on one or more imprint fields (also referred to as: pattern areas or shot areas). The imprinting process may be performed repeatedly on a plurality of substrates 102 by the nanoimprint lithography system 100. The processor 140 may be used to control the imprinting process.

In an alternative embodiment, a similar process may be performed to planarize the substrate 102. In the case of planarizing, substantially the same steps discussed herein with respect to FIG. 2 are performed, except that a patternless superstrate is used in place of the template. Thus, it should be understood that the following description is also applicable to a planarizing method. When using as superstrate, the superstrate may be the same size or larger than the substrate 102.

The beginning of the imprinting process may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field i (index i may be initially set to 1) of the substrate 102 to a fluid dispense position below the fluid dispenser 122. The substrate 102, may be divided into N imprint fields, wherein each imprint field is identified by an index i. In which N is a real integer such as 1, 10, 75, etc. $\{N \in \mathbb{Z}^+\}$. In a dispensing step S202, the processor 140 may cause the fluid dispenser 122 to dispense formable material onto an imprint field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S202, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc.

After, the droplets are dispensed, then a contacting step S204 may be initiated, the processor 140 may cause one or both of the substrate positioning stage 106 and a template positioning stage to bring the patterning surface 112 of the template 108 into contact with the formable material 124 in imprint field i.

During a spreading step S206, the formable material 124 then spreads out towards the edge of the imprint field i and the mold sidewalls. The edge of the imprint field may be defined by the mold sidewalls. How the formable material 124 spreads and fills the mold can be observed via the field camera 136 and may be used to track a progress of a fluid front of formable material.

In a curing step S208, the processor 140 may send instructions to the radiation source 126 to send a curing illumination pattern of actinic radiation through the template 108, the mold 110 and the patterning surface 112. The curing illumination pattern provides enough energy to cure (polymerize) the formable material 124 under the patterning surface 112.

In a separation step S210, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S202. In an embodiment, additional processing is performed on the substrate 102 in a processing step S212 to create an article of manufacture (e.g. semiconductor device) by forming a pattern or a layer of the dispensed material on the substrate and processing the formed pattern or layer to make the article. In an embodiment, each imprint field includes a plurality of devices.

The further processing in processing step S212 may include etching processes to transfer a relief image into the substrate that corresponds to the pattern in the patterned layer or an inverse of that pattern. The further processing in processing step S212 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Figure 3A:
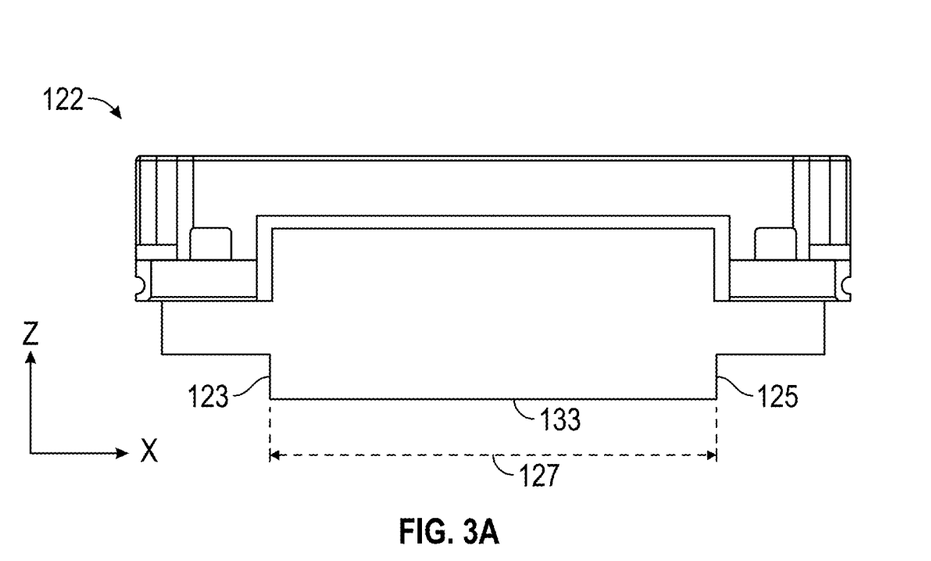
FIG. 3A shows a side view of a dispenser in accordance with an example embodiment.
Figure 3B:
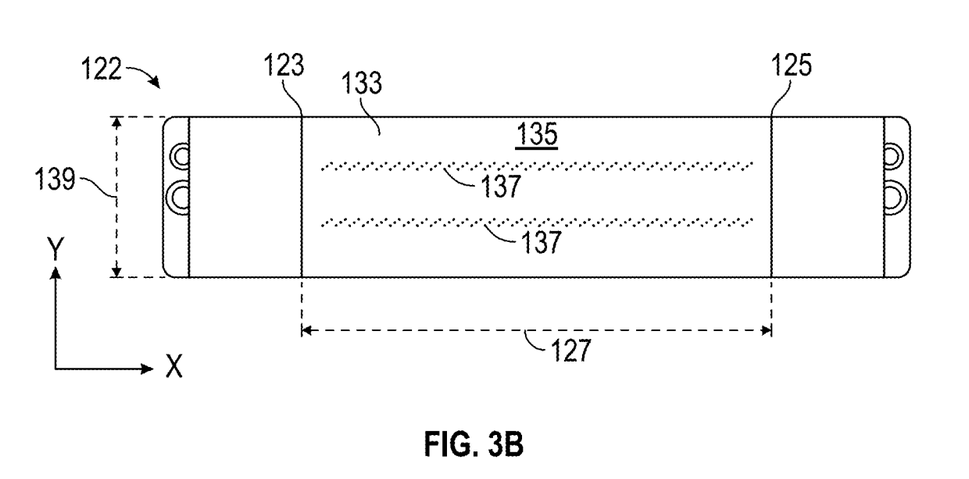
FIG. 3B shows an underside view of the dispenser of FIG. 3A in accordance with an example embodiment.

Referring now to FIG. 3A, a side view of the dispenser 122 is shown. The dispenser 122 includes a faceplate 133 with a first end 123 and a second end 125. The faceplate 133 has a length 127 extending in an X dimension from the first end 123 to the second end 125. FIG. 3B shows an underside view of the dispenser 122. The underside view of the dispenser 122 reveals a surface 135 of the faceplate 133 in which a plurality of dispensing nozzles 137 are formed. The number of nozzles 137 formed on the surface 135 of the faceplate 133 may be on the order of hundreds, for example 500 or more. The faceplate 133 includes a width 139 extending in a Y dimension, the Y dimension being perpendicular to the X dimension.

Figure 4A:
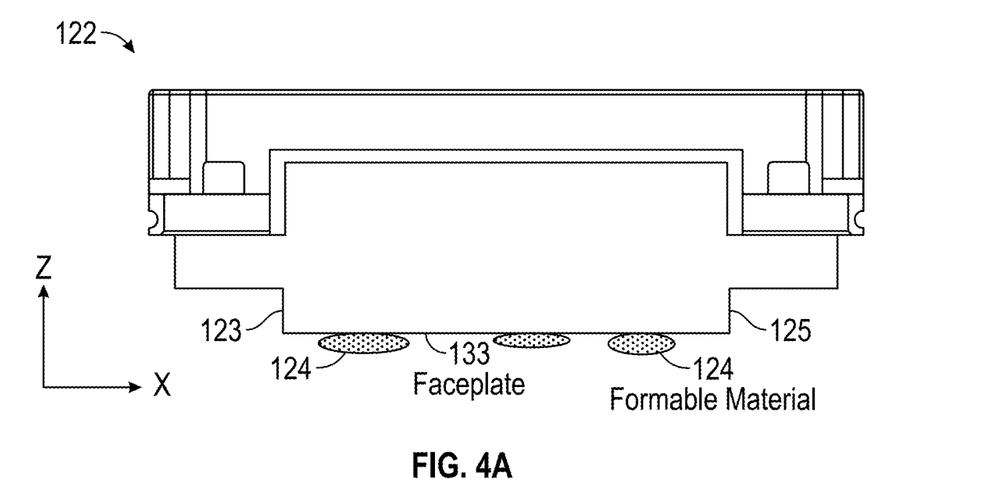
FIG. 4A shows a side view of the dispenser after formable material has accumulated on the surface of a faceplate, in accordance with an example embodiment.
Figure 4B:
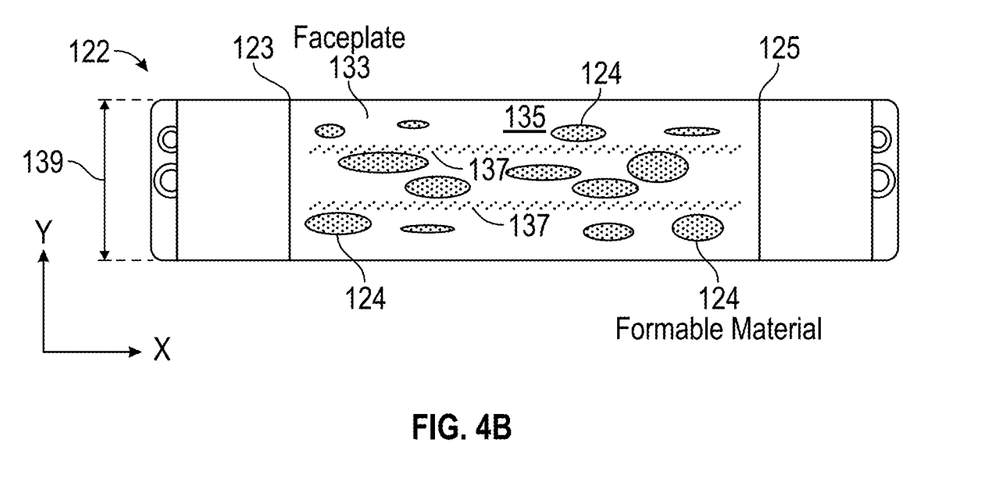
FIG. 4B shows a bottom view of the dispenser of FIG. 4A after formable material has accumulated on the surface of the faceplate, in accordance with an example embodiment.

FIGS. 4A and 4B show several views of the dispenser 122 after formable material 124 has accumulated on the surface 135 of the faceplate 133. The structure of the dispenser 122 is the same as discussed above with respect to FIGS. 3A and 3B, the only difference being that formable material 124 has accumulated on the surface 135 of the faceplate 133 after the dispenser 122 has dispensed formable material 124 many times. As shown schematically in FIGS. 4A and 4B the accumulated formable material 124 may be located with various patterns and thicknesses across the surface 135 of the faceplate 133. The formable material 124 on the surface 135 of the faceplate 133 may cause outages of nozzles when dispensing the formable material. In order to remove the resist or accumulated formable material 124 from the surface 135 of the faceplate 133 a cleaning process is applied to the dispenser 122. The cleaning process may use a non-contact cleaning method for example a vacuum apparatus (suction apparatus) may be used to remove formable material 124 from the surface 135 of the faceplate 133. The vacuum apparatus is described in further detail below with reference to FIG. 5.

Figure 5:
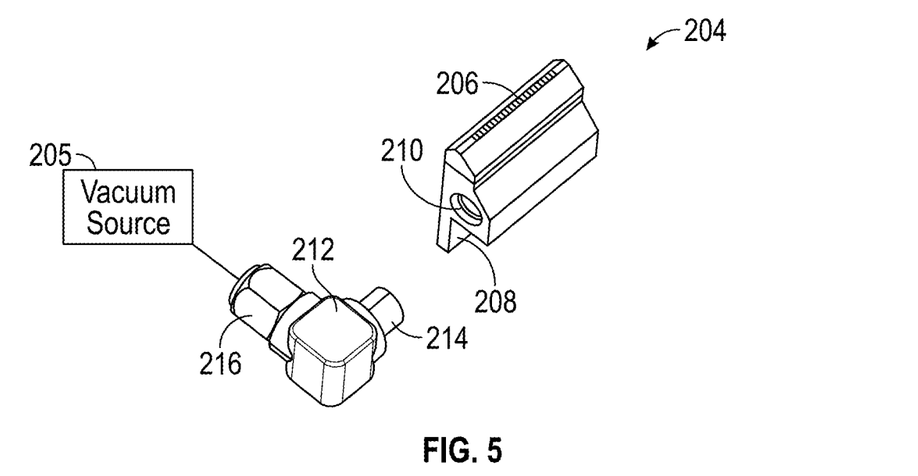
FIG. 5 shows a perspective exploded view of a vacuum apparatus in accordance with an example embodiment.

Referring now to FIG. 5 is an exploded view of an exemplary vacuum apparatus that may be used to impart a suction force on the surface 135 of the faceplate 133 of the dispenser 122. The vacuum apparatus 204 is used to clean formable material from the dispenser 122. The vacuum apparatus 204 is coupled with a vacuum source 205. The vacuum apparatus 204 may be translated across the surface 135 of the faceplate 133 using a translating mechanism (not shown). The vacuum apparatus 204 may be translated along the X-axis as shown in FIGS. 3A and 3B. The reason for translating the vacuum apparatus is to ensure the formable material may be removed from the entire surface of the faceplate 133.

The translating mechanism may be any mechanism known in the art that is suitable for imparting linear translation of an object. For example, the translating mechanism may be a linear actuator that may include: a stepper motor; a linear motor; a moving coil; a hydraulic actuator; pneumatic actuator; and the like. The linear actuator may include a position encoder. The position encoder may be a rotary or linear encoder. Such encoders are known in the art and provide position information at a particular moment in time.

The vacuum apparatus 204 includes a vacuum orifice 206. The vacuum orifice 206 may be an elongated slit shape where the length of the vacuum orifice 206 is much longer than the width of the vacuum orifice 206. For example, the ratio of the length of the vacuum orifice 206 to the width of the vacuum office 206 may be from 5:1 to 100:1, may be 10:1 to 90:1, may be 20:1 to 80:1, may be 30:1 to 70:1, or may be 40:1 to 65:1. In one example, the ratio may be 60:1. In an example embodiment, the length of the vacuum orifice 206 is substantially the same (e.g., within ±20%) as the width 139 of the faceplate 133 in the Y dimension. In an example embodiment, the width of the vacuum orifice 206 is wide enough so that it does not become clogged with formable material while being narrow enough to supply sufficient vacuum (for example, 0.5 mm, 1 mm, etc.). The vacuum orifice 206 may also have lips on each side which are similar (e.g., within ±30%) in width to the width of the vacuum orifice 206 which helps constrain the suction force to a local region of the faceplate 133. The vacuum apparatus 204 may further include a vacuum connector 212 and a connector port 210. The vacuum connector 212 may include a first end 214 that connects with the connector port 210 and a second end 216 that connects with the vacuum source 205. Thus, by activating the vacuum source 205, a suction force is applied to the vacuum orifice 206.

A vacuum force can be selectively imparted on the faceplate 133 by actuating the vacuum source 205 when the vacuum orifice 206 of the vacuum apparatus 204 travels along the X dimension. The orifice 206 of the vacuum apparatus 204 also extends across the width 139 of the faceplate 133.

Using the vacuum apparatus 204 for cleaning the formable material 124 from the surface 135 of the faceplate 133 is known as non-contact maintenance. When performing non-contact maintenance, occasionally nozzle outages are observed after maintenance is completed. This appears to occur when the suction force i.e. vacuum level is too high or the vacuum apparatus 204 is too close to the dispenser 122. Also, it is prevalent and common when using dispensers with a modified surface 135 of the faceplate 133 in which the photoresist is designed to not wet the surface 135 after the surface 135 has been modified. A non-wetting surface has a relatively low surface energy which can induce formable material that has accumulated on the surface 135 into forming large beads on the surface 135. Nozzle outages after non-contact maintenance may be recovered with a purge or fluid (change of meniscus pressure), it is assumed that the meniscus has been broken and needs to be reestablished. To mitigate this, the meniscus may be directly excited during jetting using a non-jetting waveform. A non-jetting waveform is also known as white pixel jetting. The non-jetting waveform is used so that no fluid is ejected into the process module, less fluid accumulates on the surface 135, and all dispenser nozzles dispense after maintenance. The amount of white pixel jetting should be minimized as it can cause some accumulation of fluid onto the surface 135, so only the area actively undergoing maintenance should be excited with a non-jetting waveform. The meniscus can also be excited during maintenance in regular conditions if the jetting performance after regular maintenance is not satisfactory. Directly exciting the meniscus during non-contact maintenance may reduce nozzle outages from the faceplate cleaning process.

The applicant has found that it is advantageous to perform non-contact maintenance periodically to remove excess fluid from the dispenser faceplate 133. The applicant has also found that performance of the nanoimprint lithography system 100 is improved if every nozzle is required to fire subsequently after the non-contact maintenance was performed. The applicant has found that a surface energy mismatch between the formable material 124 and surface 135 that is non-wetting increases the likelihood of a nozzle performance degradation after non-contact maintenance in the manner of the prior art is performed. The applicant has also found that this likelihood can be reduced if non-contact maintenance is performed while also exciting the meniscus of the nozzles as they are being cleaned. The applicant has also found that if the vacuum orifice drifts too close to the faceplate, the likelihood of nozzle performance degradation increases, this likelihood can be mitigated by exciting the meniscus of the nozzles as they are being cleaned. This improves the process window under which non-contact maintenance is performed.

A drop dispensing method by the nanoimprint lithography system 100 or planarization system can be used to dispense a pattern of drops of formable material 124 onto the substrate 102, which is then imprinted/planarized. Imprinting/planarizing may be done in a field by field basis or on a whole wafer basis. The drops of formable material 124 may also be deposited in a field by field basis or on a whole substrate basis. Even when the drops are deposited on a whole substrate basis generating the drop pattern is preferably done on a field by field basis.

Generating a drop pattern for a full field may include a processor 140 receiving a substrate pattern of a representative substrate 102, and a template pattern of a representative template 108.

The substrate pattern may include information about substrate topography of the representative substrate, a field of the representative substrate and/or a full field of the representative substrate. The substrate topography may be measured, generated based on previous fabrication steps and/or generated based on design data. In an alternative embodiment, the substrate pattern is featureless either because there were no previous fabrication steps or the substrate had previously been planarized to reduce topography. The substrate topography may include information about the shape of an edge such as a beveled edge or a rounded edge of the representative substrate. The substrate topography may include information about the shape and position of one or more flats or notches which identify the orientation of the substrate. The substrate topography may include information about a shape and position of a reference edge which surrounds the area of the substrate on which patterns are to be formed.

The template pattern may include information about the topography of the patterning surface 112 of the representative template. The topography of the patterning surface 112 may be measured and/or generated based on design data. In an alternative embodiment, the template pattern of the representative embodiment is featureless and may be used to planarize the substrate 102. The patterning surface 112 may be the same size as: an individual full field; multiple fields; the entire substrate, or larger than the substrate.

Once the substrate pattern and the template pattern are received, a processor 140 may calculate a distribution of formable material 124 that will produce a film that fills the volume between the substrate and the patterning surface when the substrate and the patterning surface are separated by a gap during imprinting. The distribution of formable material on the substrate may take the form of: an areal density of formable material; positions of droplets of formable material; and/or volume of droplets of formable material. Calculating the distribution of formable material may take into account one or more of: material properties of the formable material; material properties of the patterning surface; material properties of the substrate surface; spatial variation in volume between the patterning surface and the substrate surface; fluid flow; evaporation; etc.

An initial position of the vacuum apparatus 204 is set relative to the surface 135 of the faceplate 133, prior to any accumulation of formable material on the faceplate 133. That is, the faceplate 133 does not have any formable material on the surface 135. The position of the vacuum apparatus 204 is changed relative to the surface 135 of the faceplate 133 by changing the angle of the vacuum apparatus 204 relative to the surface 135 of the faceplate 133, the distance between the vacuum apparatus 204 and the faceplate 133, or the angle of direction of travel of the vacuum apparatus 204 relative to the surface 135 of the faceplate 133.

The vacuum apparatus 204 is used to clean the surface 135 of the faceplate 133. The vacuum apparatus 204 may be mounted to a tray such that when a translation mechanism actuates, the tray, and the vacuum apparatus 204 all translate together across the surface 135 of the faceplate 133 in the X dimension. For this reason, it is possible to actuate the vacuum to suction formable material 124 off the surface 135 of the faceplate 133. Accordingly, the vacuum apparatus 204 travels along the X dimension at a distance from the surface 135 of the faceplate 133 while sucking formable material 124 into the orifice 206.

As the vacuum apparatus 204 travels along the X dimension from a first end 123 to a second end 125, the vacuum pressure may be increased (become more negative) as the vacuum apparatus 204 approaches the second end 125. The increase in the vacuum pressure may be from 25% higher to 100% higher, from 33% higher to 80% higher, or from 50% to 66% higher. The increase in vacuum pressure may be then held at the increased amount until reaching the second end 125 of the faceplate 133. The benefit of increases in the vacuum pressure toward the second end 125 of the faceplate 133 is that the sudden increase assists in suctioning away formable material 124 that has been displaced during the vacuuming that has occurred up until this point in the X dimension. That is, during a time where the initial vacuum pressure is set, as the vacuum apparatus 204 travels across the faceplate 133 in the X dimension, some of the formable material 124 will be sucked up, while some will be displaced in a direction toward to the second end 125 of the faceplate 133. While some of the displaced formable material 124 may be suctioned as the vacuum apparatus 204 continues to travel in the X dimension, other amounts will continue to displace in the direction of the second end 125 of the faceplate 133. The sudden increase in vacuum pressure near the second end 125 of the faceplate 133 assists in suctioning off the final amount of displaced formable material 124.

As described above, the nanoimprint lithography system 100 may be regulated, controlled, and/or directed by the one or more processors 140 (controller). This includes all of the method steps described above, including controlling the hardware that changes all three position factors that impact the position of the vacuum apparatus 204 relative to the faceplate 133, controlling a translation mechanism to control the movement of the vacuum apparatus 204, controlling when the vacuum pressure is applied and at what pressure. While not shown in the figures, it should be understood that any of the mechanical adjustments (i.e., adjusting the angle of approach, the angle of the vacuum apparatus relative to the faceplate, and the distance between the vacuum apparatus and the faceplate) can be controlled by the controller via a motor or other known automation means.

Figure 6:
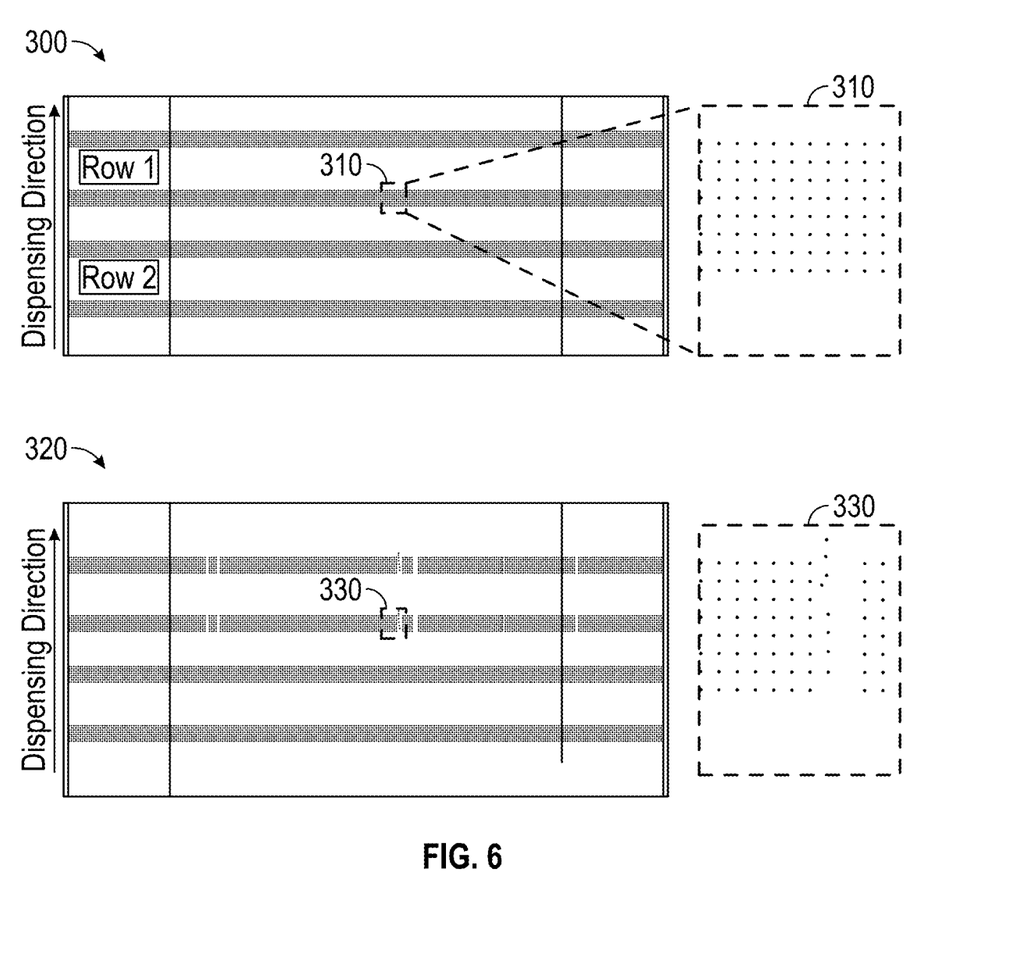
FIG. 6 shows a schematic of nozzles performing as expected before non-contact maintenance and several nozzle outages after non-contact maintenance.

Referring now to FIG. 6, a test pattern of dispensed drops is shown before and after non-contact maintenance of the dispenser 122. The first test pattern of dispensed drops 300 shows an exemplary pattern of dispensed drops when all nozzles are firing as expected before maintenance of the dispenser 122. The test pattern of dispensed drops is a pattern of drops dispensed onto a test substrate by the nanoimprint lithography tool 100 and is used to measure the performance of the fluid dispenser 122. An expanded portion 310 of the test pattern of dispensed drops 300 is shown that indicates the droplets from the nozzles are not missing or deviated. The second test pattern of dispensed drops 320 is an example of a pattern of dispensed drops after non-contact maintenance is performed without white pixel jetting being performed at the same time. As can be observed in the expanded portion 330 of the test pattern of dispensed drops 320, there are several nozzle outages (drops are missing or drops are at deviated positions) immediately after maintenance. Therefore, it is an important goal to use non-contact maintenance while avoiding nozzle outages such as missing fluid or deviated droplets from the nozzles.

Figure 7A:
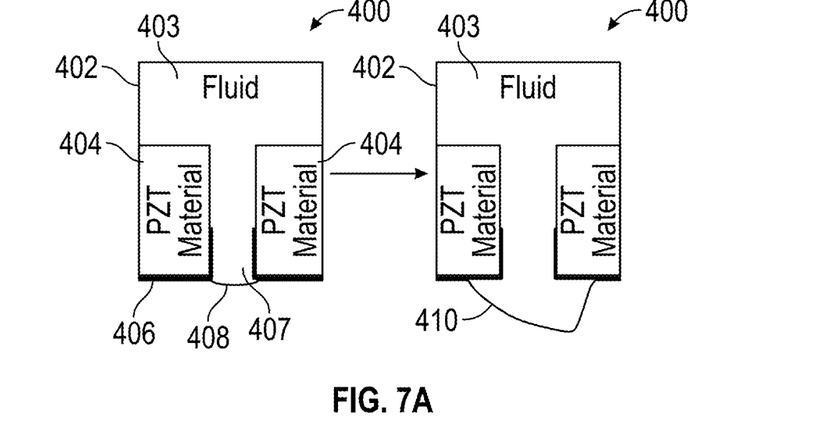
FIG. 7A shows a schematic of a nozzle including an ink chamber in good condition and a nozzle that requires maintenance.
Figure 11A:
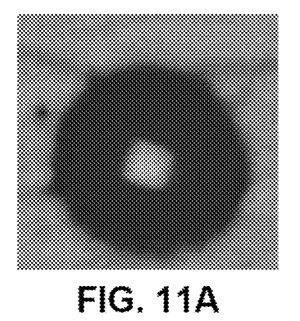
FIGS. 11A-C are micrographs menisci in various states.
Figure 11B:
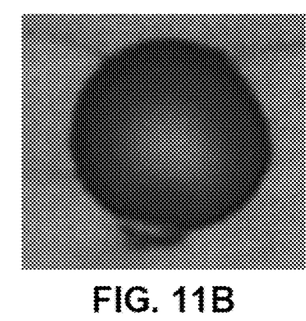
Figure 11C:
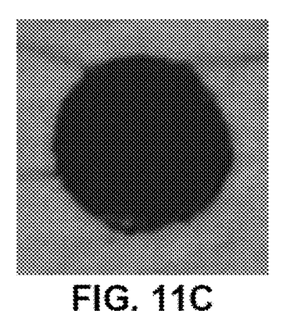

Referring now to FIG. 7A, a nozzle 400 in good condition on the left side and the same nozzle 400 in a condition where maintenance is required after regular jetting on the right side are shown. The nozzle 400 includes a fluid chamber 402 with fluid 403 or formable material disposed within the dispenser that is to be dispensed out of the nozzle 400. In the embodiment shown in the present disclosure, the nozzle 400 includes a piezoelectric transducer (PZT) material 404. Although PZT material is shown in FIG. 7A, any well-known material may be used for the nozzle 400. The PZT material 404 may include a non-wetting coating material 406 to prevent a surface portion of the PZT material 404 from accumulating fluid 403 on the surface 135 of the faceplate 133. In an embodiment, the non-wetting coating material 406 has a higher surface energy than the surface 135 of the faceplate 133 that does not have the non-wetting coating material 406. In an embodiment, the surface 135 is modified to be non-wetting for the formable material 403. In an embodiment, a portion of the surface 135, and/or the interior of the nozzle is non-wetting for the formable material 403. In an embodiment, the non-wetting coating is a polyamide material. The surface of the fluid 403 within the nozzle 400 forms a meniscus 408. The meniscus 408 may be relatively flush with an aperture 407 of the nozzle that is in good condition for jetting drops on a regular basis. In an embodiment, the meniscus is concave or convex and is located within the nozzle or is relatively flush with the aperture 407. The position and shape of the meniscus 408 can be controlled by adjusting pressures of a supply pump and a return pump which control passage of fluid through the dispenser. The control over the position and shape of the meniscus for individual nozzles can be disrupted when an individual meniscus is broken. FIG. 11A is an illustration of a micrograph of a convex meniscus. FIG. 11B is a micrograph of a concave meniscus. FIG. 11C is a micrograph of a broken meniscus.

The nozzle 400 on the right side requires maintenance because the accumulated formable material 410 has accumulated to a point that the likelihood of formable material dripping onto the substrate has become unacceptable. Typically, a nozzle requires maintenance after several hours, days or weeks of regular jetting. Regular jetting includes applying a voltage signal to the PZT material 404. The voltage signal or jetting waveform causes mechanical deformations within the PZT material 404 which in turn cause the fluid/formable material 403 to be dispensed from the aperture 407 of the nozzle. Due to jetting which causes the fluid 403 to be dispensed from the nozzle, fluid 403 may accumulate at the surface of the nozzle after millions of drop dispensing cycles. When there is an accumulation of fluid or formable material 403 the nozzle requires maintenance to prevent deterioration during fluid dispensation. Thus, a vacuum apparatus is used for imparting a suction force on the nozzle to remove the fluid accumulation caused from jetting. In an embodiment, the walls of the nozzles may be made of PZT material. In an embodiment, one or more walls of the fluid chamber 402 that are connected to the nozzle 400 may be made of a PZT material. In an embodiment, the PZT transducer may cause mechanical deformations in a diaphragm connected to the fluid chamber or nozzle. In an embodiment, instead of using a PZT material to initiate jetting, a heater is used to generate bubbles to initiate jetting. In an embodiment, instead of using a PZT material to initiate jetting, a MEMS or other deformable device is used to initiate jetting.

Figure 7B:
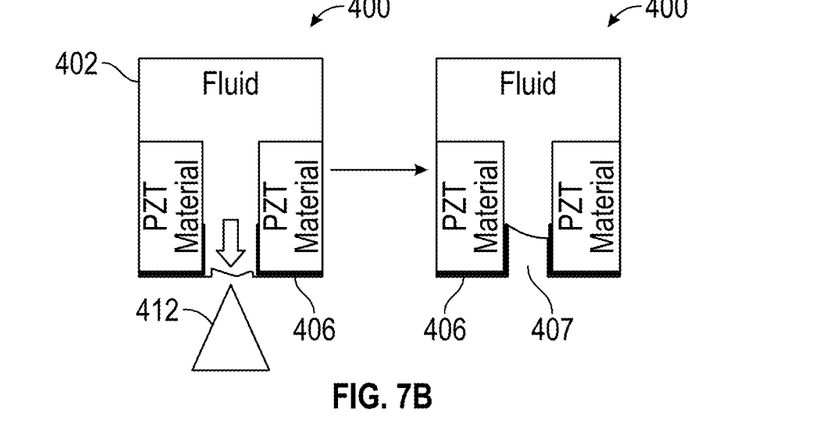
FIG. 7B shows a schematic of the nozzle from FIG. 7A that requires maintenance where non-contact maintenance using a vacuum apparatus causing a broken meniscus in the nozzle.

Referring now to FIG. 7B, the nozzle 400 on the left side has non-contact maintenance applied by the vacuum apparatus 412 that imparts a suction force on the accumulated formable material 410. If the suction force is too great or if the vacuum apparatus 412 is too close to the nozzle 400, then the non-contact maintenance may cause the meniscus 408 to break as shown in the nozzle 400 on the right side of FIG. 7B. In an embodiment, the surface 135 of the faceplate is bowed or otherwise not flat, which can make it difficult to ensure that the vacuum apparatus 412 is the proper distance from the nozzle 400 as the nozzle travels across the faceplate. If the meniscus 408 is broken as shown, this may result in nozzle outages, drop volume variation, misshapen drops, and/or misalignment of drop landing positions. The present disclosure focuses on avoiding a broken meniscus as a result of non-contact maintenance.

Figure 7C:
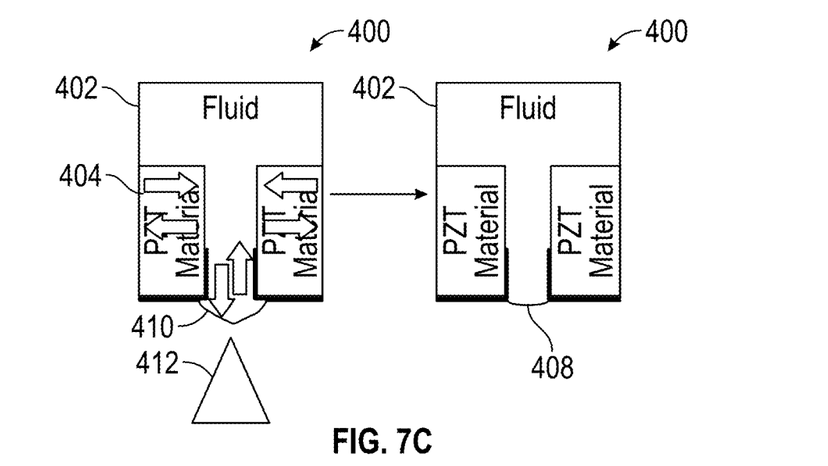
FIG. 7C shows a schematic of the nozzle from FIG. 7A that requires maintenance where non-contact maintenance using a vacuum apparatus, in accordance with an example embodiment.

Referring now to FIG. 7C, non-contact maintenance is performed on the nozzle 400, yet the meniscus 408 remains intact. FIG. 7C shows that during non-contact maintenance of the nozzle 400 when the vacuum apparatus 412 is applied to remove the accumulated formable material 410, meniscus excitation occurs by applying a voltage signal to the PZT material 404 causing the PZT material 404 to deform. The deformation of the PZT material 404 is such that the PZT material 404 expands and applies a force to the fluid 403. The deformation of the PZT material 404 is enough to cause the PZT material 404 to expand perpendicular to a direction in which the fluid 403 is dispensed from the nozzle 400. The force applied by the PZT material 404 should not exceed a threshold sufficient to cause fluid 403 to be dispensed from the nozzle 400. The force applied by the PZT material 404 should be below the threshold that causes fluid 403 to be dispensed from the nozzle 400. Applying a voltage to the PZT material 404 during non-contact maintenance of the nozzle 400 using a vacuum apparatus 412 may result in maintaining the meniscus 408 of the nozzle 400 while removing the normal accumulation 410 caused by jetting of the nozzles. In an alternative embodiment, the menisci of one or more nozzles is excited in a non-jetting manner by one or more of: PZT material that supplies a force to a fluid in a fluid nozzle; PZT material that supplies a force to a fluid in a chamber that is in fluid connection with a fluid nozzle; a MEMS device that supplies a force to fluid in fluid connection with a fluid nozzle; and a heater that creates a bubble that is in fluid communication with a fluid nozzle. The excitation of the meniscus or menisci may include applying a voltage to a jetting means corresponding to the portion of dispenser nozzle(s) such that the minimum amount of voltage required to vibrate the menisci without causing material to be dispensed from the portion of nozzles.

Figure 8:
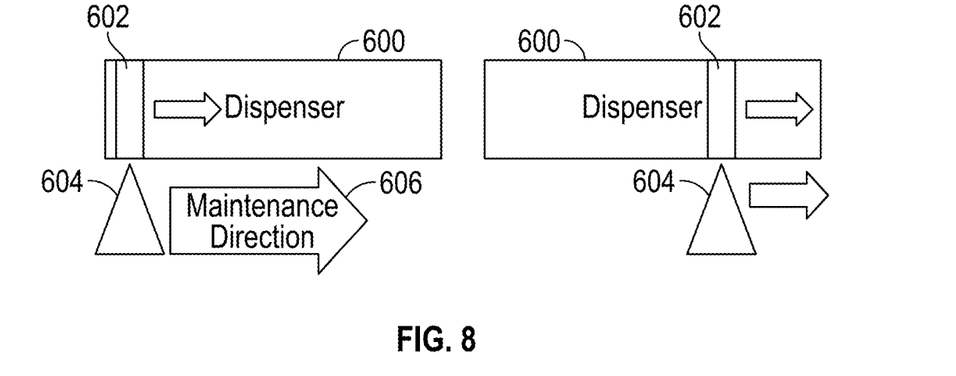
FIG. 8 shows a schematic emphasizing a selective area with meniscus excitation during maintenance, in accordance with an example embodiment.
Figure 10:
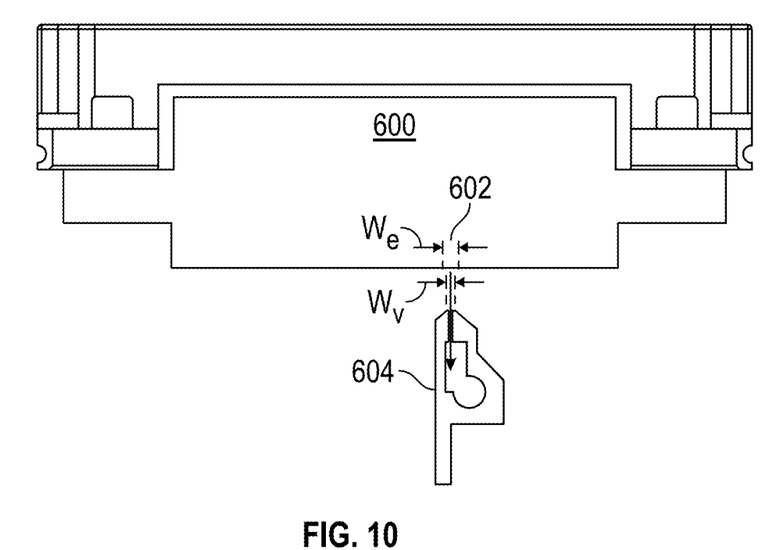
FIG. 10 shows a schematic emphasizing a width of a selective area with meniscus excitation during maintenance relative to a characteristic width of a vacuum apparatus, in accordance with an example embodiment.

FIG. 8 is a schematic that emphasizes only a portion 602 of the dispenser 600 being excited during the non-contact maintenance. As each nozzle area is selectively excited as the vacuum apparatus 604 moves over a specific area of the dispenser. This allows for minimal meniscus excitation. Too much meniscus excitation may add to the accumulation of fluid to the faceplate. FIG. 8 shows the vacuum apparatus 604 moving in a direction 606 from the left side of the dispenser 600 to the right side of the dispenser 600 known as the maintenance direction 606. The meniscus excitation is applied to an area on the dispenser 600 that is adjacent the vacuum apparatus 604 such that only a small portion of the dispenser 600 has the associated nozzles have a force applied by the PZT material to cause meniscus excitation. For example, the vacuum apparatus 604 may have a rectangular vacuum orifice in which the narrowest width is 0.5 mm. The vacuum apparatus 604 may also have 0.3 mm lips which surround the rectangular orifice. The vacuum apparatus may have a characteristic width ($w_v$) which includes the width of the narrowest width of the vacuum orifice and twice the width of the lips which in this example is 1.1 mm. Only a small portion of the dispenser 600 within an excited width ($w_e$) has the associated nozzles have their menisci excited. In an embodiment, the excited width is greater than the characteristic width ($w_e > w_v$) as illustrated in FIG. 10. The excited width 602 is also limited by the pitch of the nozzle dispensers such that less than 2, 3, 4, 5, 6, 7, 8, 9 or 10 nozzles are excited at any one time.

Figure 9:
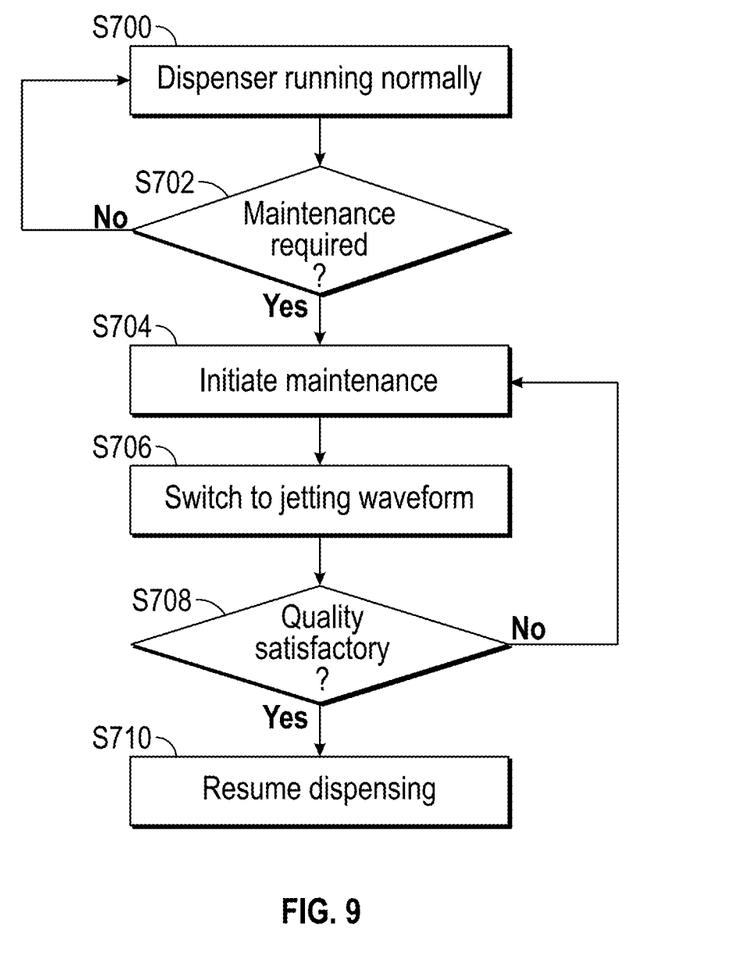
FIG. 9 illustrates a block diagram showing white pixel jetting during non-contact maintenance of the dispenser in accordance with an example embodiment.

FIG. 9 is a flow chart illustrating exemplary steps before, during and after non-contact maintenance to show when white pixel jetting is implemented to prevent meniscus breakage in the fluid dispensing nozzles in accordance with an embodiment of the present disclosure. In the first block S700, the dispenser is running normally which may cause normal accumulation on the surface of the nozzle. In the second block S702 it is determined whether the dispenser requires maintenance from normal formable material accumulation. If the dispenser does not need to be maintained (insufficient accumulation), the following step may return to the first block S700 and the dispenser may continue to run normally (jetting). Alternatively, if there is sufficient accumulation and it is determined that the dispenser requires maintenance, the next step is to retract dispenser and begin the maintenance process S704. The white pixel waveform is loaded in and maintenance is initiated.

During the maintenance step S704, the vacuum apparatus imparts a suction force on a partial area of the dispenser. The partial area of the dispenser exposed to the suction force is the area wherein the nozzles are excited to avoid breakage of the meniscus. After completing the maintenance of the dispenser, in step S706 the white pixel waveform is switched to a jetting waveform to dispense fluid from the nozzles as a test for quality. If the dispenser quality is satisfactory, yes in step S708, the dispenser may proceed with dispensing the formable material in step S710. Alternatively, if the dispenser quality is unsatisfactory, no in step S708, the white pixel waveform is loaded and maintenance is initiated again in step S704.

The dispenser waveform can be changed from single primary drop regime to nozzle wetting with drop formation regime by shifting the basic jetting parameters. During maintenance activities, each nozzle can be kept wetted while removing the accumulated resist which increases the viable process window for dispensers with and without a non-wetting coating on the faceplate. The dispenser waveform is changed by shifting the basic jetting parameters such that each nozzle can be kept wetted while removing accumulated resist during maintenance of the dispenser.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of cleaning a dispenser including a plurality of nozzles with a faceplate and a plurality of jetting units for jetting a material from the plurality of nozzles, wherein each of the plurality of nozzles has one of the plurality of jetting units, the method comprising:
    applying a suction force onto a surface of the faceplate using a suction apparatus;
    translating the suction apparatus relative to the faceplate such that a portion of nozzles from the plurality of nozzles being exposed to the suction force changes; and
    vibrating each meniscus of the portion of nozzles being exposed to the suction force by the suction apparatus by operating the jetting units,
    wherein the suction force is applied without the surface and the suction apparatus being in contact, and
    wherein, in the vibrating, each meniscus associated with nozzles from the plurality of nozzles that are not being exposed to the suction force is not vibrated,
    wherein the suction apparatus includes a rectangular orifice with lips that surround the rectangular orifice, the suction apparatus includes a characteristic width, which is a sum of a narrowest width of the rectangular orifice and twice a width of the lips,
    wherein, in the vibrating, the characteristic width is less than an excited width of the dispenser, the excited width referring to a width of the portion of nozzles with their associated menisci being vibrated while being exposed to the suction force.

2. The method according to claim 1, wherein a number of nozzles associated with the portion of nozzles being exposed to the suction force is less than a total number of the plurality of nozzles.

3. The method according to claim 1, wherein the faceplate has a non-wetting coating.

4. The method according to claim 1, wherein the dispenser is a piezoelectric jetting type dispenser.

5. The method according to claim 1, wherein, in the vibrating, each meniscus being exposed to the suction force by the suction apparatus is vibrated by applying a voltage to the jetting unit for each nozzle that is exposed to the suction force.

6. The method according to claim 5, wherein, in the vibrating, the voltage applied to the jetting units corresponding to the portion of nozzles is the minimum amount of voltage required to vibrate each meniscus without causing the material to be jetted from the portion of nozzles.

7. The method according to claim 1, wherein, in the vibrating, the portion of nozzles being exposed to the suction force by the suction apparatus is vibrated so that the portion of nozzles moves in a direction perpendicular to a dispensing direction.

8. The method according to claim 1, wherein, in the vibrating, a non-jetting waveform is applied to the jetting units corresponding to the portion of nozzles being exposed to the suction force by the suction apparatus.

9. The method according to claim 1, wherein, in the vibrating, no material is jetted into a process module from the portion of nozzles being exposed to the suction force by the suction apparatus.

10. The method according to claim 1, wherein each nozzle from the plurality of nozzles forms a meniscus, wherein the meniscus is a curved upper surface of the material in the nozzle.

11. The method according to claim 1, wherein, in the vibrating, each meniscus of the portion of nozzles is vibrated while the portion of nozzles is exposed to the suction force by the suction apparatus, so that a force applied by the jetting units to the material in the exposed portion of nozzles is below a threshold required to jet the material from the exposed portion of nozzles.

12. The method according to claim 1, wherein the narrowest width of the rectangular orifice is 0.5 mm.

13. A dispensing system, comprising:
    a dispenser configured to jet a material, including a faceplate with a plurality of nozzles and a plurality of jetting units for jetting the material from the plurality of nozzles, wherein each of the plurality of nozzles has one of the plurality of jetting units;
    a suction apparatus for applying a suction force onto the faceplate, wherein the suction apparatus includes a rectangular orifice with lips that surround the rectangular orifice, the suction apparatus includes a characteristic width, which is a sum of a narrowest width of the rectangular orifice and twice a width of the lips;
    one or more processors; and
    one or more memories storing instructions, when executed by the one or more processors, causes the dispensing system to:
    applying the suction force onto a surface of the faceplate using the suction apparatus;
    translating the suction apparatus relative to the faceplate such that a portion of nozzles from the plurality of nozzles being exposed to the suction force changes; and
    vibrating each meniscus of the portion of nozzles being exposed to the suction force by the suction apparatus by operating the jetting units,
    wherein the suction force is applied without the surface and the suction apparatus being in contact, and
    wherein, in the vibrating, each meniscus associated with nozzles from the plurality of nozzles that are not being exposed to the suction force is not vibrated, and the characteristic width is less than an excited width of the dispenser, the excited width referring to a width of the portion of nozzles with their associated menisci being vibrated while being exposed to the suction force.

14. The dispensing system according to claim 13, wherein the narrowest width of the rectangular orifice is 0.5 mm.

15. A method of making an article, comprising:
    cleaning a dispenser including a faceplate with a plurality of nozzles and a plurality of jetting units for jetting a material from the plurality of nozzles, wherein each of the plurality of nozzles has one of the plurality of jetting units, the cleaning including:
- applying a suction force onto a surface of the faceplate using a suction apparatus;
- translating the suction apparatus relative to the faceplate such that a portion of nozzles from the plurality of nozzles being exposed to the suction force changes; and
- vibrating each meniscus of the portion of nozzles being exposed to the suction force by the suction apparatus by operating the jetting units, wherein the suction force is applied without the surface and the suction apparatus being in contact;

jetting the material onto a substrate using the dispenser;

forming a pattern or a layer of the jetted material on the substrate; and processing the formed pattern or layer to make the article, wherein, in the vibrating, each meniscus associated with nozzles from the plurality of nozzles that are not being exposed to the suction force is not vibrated, wherein the suction apparatus includes a rectangular orifice with lips that surround the rectangular orifice, the suction apparatus includes a characteristic width, which is a sum of a narrowest width of the rectangular orifice and twice a width of the lips, wherein, in the vibrating, the characteristic width is less than an excited width of the dispenser the excited width referring to a width of the portion of nozzles with their associated menisci being vibrated while being exposed to the suction force.

16. The method of making an article according to claim 15, wherein the narrowest width of the rectangular orifice is 0.5 mm.

* * * * *